(12) United States Patent
Lin et al.

(10) Patent No.: US 9,219,016 B2
(45) Date of Patent: Dec. 22, 2015

(54) STRUCTURE DESIGN FOR 3DIC TESTING

(75) Inventors: Jing-Cheng Lin, Hsin-Chu (TW); Po-Hao Tsai, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 231 days.

(21) Appl. No.: 13/247,659

(22) Filed: Sep. 28, 2011

(65) Prior Publication Data
US 2013/0077272 A1    Mar. 28, 2013

(51) Int. Cl.
*H05K 7/00* (2006.01)
*H01L 21/66* (2006.01)
*H01L 23/00* (2006.01)
*H01L 23/31* (2006.01)

(52) U.S. Cl.
CPC ........... *H01L 22/32* (2013.01); *H01L 24/11* (2013.01); *H01L 24/13* (2013.01); *H01L 23/3192* (2013.01); *H01L 24/16* (2013.01); *H01L 24/81* (2013.01); *H01L 2224/0401* (2013.01); *H01L 2224/05024* (2013.01); *H01L 2224/05027* (2013.01); *H01L 2224/05166* (2013.01); *H01L 2224/05572* (2013.01); *H01L 2224/05647* (2013.01); *H01L 2224/10126* (2013.01); *H01L 2224/1146* (2013.01); *H01L 2224/1147* (2013.01); *H01L 2224/1182* (2013.01); *H01L 2224/11823* (2013.01); *H01L 2224/13022* (2013.01); *H01L 2224/1369* (2013.01); *H01L 2224/13082* (2013.01); *H01L 2224/13083* (2013.01); *H01L 2224/13111* (2013.01); *H01L 2224/13113* (2013.01); *H01L 2224/13118* (2013.01); *H01L 2224/13139* (2013.01); *H01L 2224/13144* (2013.01); *H01L 2224/13147* (2013.01); *H01L 2224/13155* (2013.01); *H01L 2224/13157* (2013.01); *H01L 2224/13164* (2013.01); *H01L 2224/13565* (2013.01); *H01L 2224/13566* (2013.01); *H01L 2224/13578* (2013.01); *H01L 2224/13644* (2013.01); *H01L 2224/13655* (2013.01); *H01L 2224/16148* (2013.01); *H01L 2224/73204* (2013.01); *H01L 2224/81193* (2013.01); *H01L 2224/81815* (2013.01); *H01L 2224/94* (2013.01); *H01L 2924/00014* (2013.01)

(58) Field of Classification Search
CPC ........... H05K 7/02; H01L 2924/00014; H01L 2224/05027; H01L 2224/05572; H01L 2224/05647; H01L 2924/01029
USPC .................. 174/258–261, 263; 361/760–762; 257/759, 642, 702, 737; 438/612, 107, 438/614
See application file for complete search history.

(56) References Cited

U.S. PATENT DOCUMENTS

| 4,811,082 | A | 3/1989 | Jacobs et al. |
| 4,990,462 | A | 2/1991 | Sliwa, Jr. |
| 5,075,253 | A | 12/1991 | Sliwa, Jr. |

(Continued)

*Primary Examiner* — Yuriy Semenenko
(74) *Attorney, Agent, or Firm* — Slater & Matsil, L.L.P.

(57) ABSTRACT

A work piece includes a first copper-containing pillar having a top surface and sidewalls, and a first protection layer on the sidewalls, and not over the top surface, of the first copper-containing pillar. A test pad includes a second copper-containing pillar having a top surface and sidewalls. The test pad is electrically coupled to the first copper-containing pillar. A second protection layer is disposed on the sidewalls, and not over the top surface, of the second copper-containing pillar. The first and the second protection layers include a compound of copper and a polymer, and are dielectric layers.

15 Claims, 15 Drawing Sheets

(56) References Cited

U.S. PATENT DOCUMENTS

| | | |
|---|---|---|
| 5,380,681 A | 1/1995 | Hsu |
| 5,481,133 A | 1/1996 | Hsu |
| 6,002,177 A | 12/1999 | Gaynes et al. |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,355,501 B1 | 3/2002 | Fung et al. |
| 6,434,016 B2 | 8/2002 | Zeng et al. |
| 6,448,661 B1 | 9/2002 | Kim et al. |
| 6,461,895 B1 | 10/2002 | Liang et al. |
| 6,562,653 B1 | 5/2003 | Ma et al. |
| 6,570,248 B1 | 5/2003 | Ahn et al. |
| 6,600,222 B1 | 7/2003 | Levardo |
| 6,607,938 B2 | 8/2003 | Kwon et al. |
| 6,661,085 B2 | 12/2003 | Kellar et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 2002/0047200 A1 | 4/2002 | Bai |
| 2003/0219966 A1* | 11/2003 | Jin et al. .......... 438/612 |
| 2004/0007778 A1* | 1/2004 | Shinozaki et al. ........ 257/759 |
| 2004/0126927 A1* | 7/2004 | Lin et al. ............ 438/107 |
| 2006/0267615 A1 | 11/2006 | Grilletto et al. |
| 2008/0185716 A1* | 8/2008 | Huang .............. 257/737 |
| 2009/0149016 A1* | 6/2009 | Park et al. ............ 438/614 |
| 2009/0197114 A1* | 8/2009 | Shih et al. ............ 428/647 |
| 2011/0193218 A1* | 8/2011 | Arvin et al. ............. 257/737 |
| 2011/0304042 A1 | 12/2011 | Lin et al. |
| 2013/0092935 A1 | 4/2013 | Wang et al. |

\* cited by examiner

STRUCTURE DESIGN FOR 3DIC TESTING

BACKGROUND

In the packaging of integrated circuits, a plurality of package components may be bundled in the same package. The package components may include device dies, interposers, package substrates, printed circuit boards (PCB), and the like.

Typically, before the packaging, the device wafers are tested (probed), so that known-good-dies can be selected and packaged, while failed dies are not packaged. After the packaging is finished, the resulting packages are also probed, so that failed packages may be identified. The failed packages may be caused by defective joints, the damages occurring in the packaging processes, and the problems introduced by interposers, package substrates, and PCBs. However, after the packaging is finished, even if defective packages may be identified in the test, it is difficult to isolate the exact locations of the problems, and hence it is difficult to use the probing results to guide the future manufacturing process.

SUMMARY

In accordance with one aspect, protection layers are formed on the sidewalls of copper-containing metal pillars through the reaction of the copper pillar and a polymer that is disposed on the sidewalls of the metal pillar. The protection layers have the function of protecting the copper-containing metal pillars from the oxidation in the die-to-wafer bonding process. The protection layer may extend to the top surface of, and do not cover, the copper-containing metal pillars.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Test structures for testing known-good-dies after they are bonded to other package components are provided in accordance with various embodiments. The variations of the embodiments are discussed. Throughout the various views and illustrative embodiments, like reference numbers are used to designate like elements.

Figure 1:
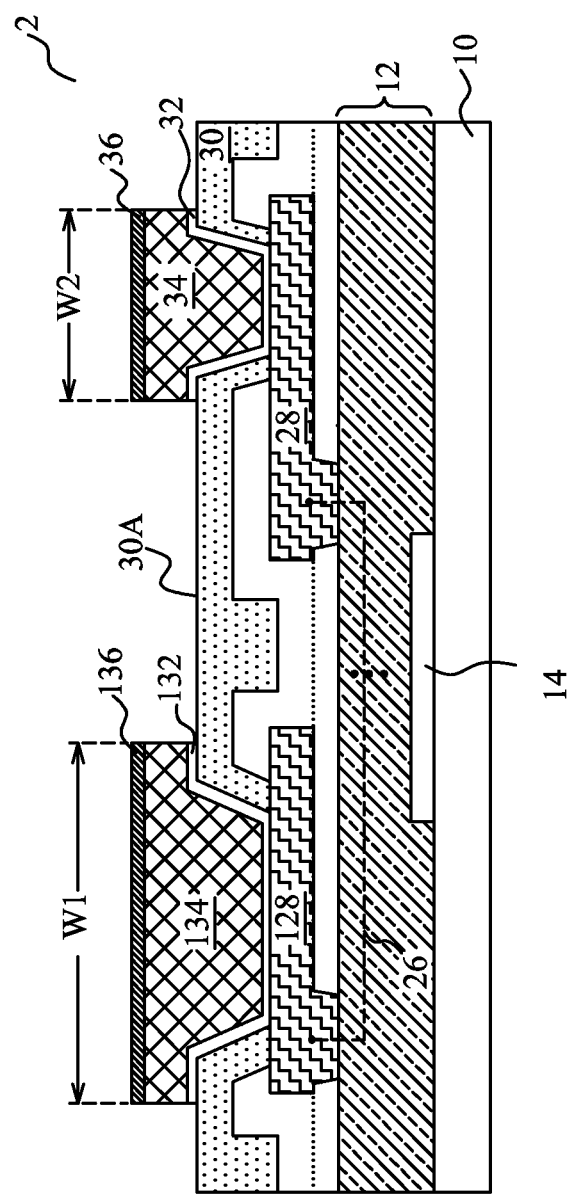
FIGS. 1 through 5 are cross-sectional views of intermediate stages in the formation of a package structure in accordance with various embodiments, wherein the package structure comprises a test pad that further includes a copper-containing pillar.

Referring to FIG. 1, work piece 2, which includes substrate 10, is provided. Work piece 2 may be a device die that includes active devices such as transistors therein, although it may also be a package substrate or an interposer that does not have active devices therein. In an embodiment wherein work piece 2 is a device die, substrate 10 may be a semiconductor substrate such as a silicon substrate, although it may include other semiconductor materials. Semiconductor devices 14 such as transistors may be formed at a surface of substrate 10. Interconnect structure 12, which includes metal lines and vias (not shown) formed therein and connected to semiconductor devices 14, is formed over substrate 10. The metal lines and vias may be formed of copper or copper alloys, and may be formed using damascene processes. Interconnect structure 12 may include an inter-layer dielectric (ILD) and inter-metal dielectrics (IMDs). For simplicity, substrate 10, interconnect structure 12, and semiconductor devices 14 are not shown in subsequent drawings, although they may exist in each of the figures.

Metal pads 28 and 128 are formed over interconnect structure 12, and may be disposed at a same level (level with each other), and formed of a same material. The materials of metal pads 28 and 128 may comprise aluminum (Al), copper (Cu), aluminum copper (AlCu), silver (Ag), gold (Au), nickel (Ni), tungsten (W), alloys thereof, and/or multi-layers thereof. Metal pads 28 and 128 may be electrically interconnected, for example, through interconnect structure 12, wherein line 26 represents the electrical connection. Metal pads 28 and 128 may be electrically coupled to semiconductor devices 14, for example, through the underlying interconnect structure 12. Dielectric layers, which may include one or more dielectric layers (including dielectric layer 30) may be formed to cover portions of metal pads 28 and 128. In an exemplary embodiment, dielectric layer 30 is formed of polyimide or other known dielectric materials. The passivation layers may also have a composite structure including a silicon oxide layer, a silicon nitride layer, a polyimide layer, and the like.

Under-bump-metallurgies (UBMs) 32 and 132 are formed over, and electrically connected to, metal pads 28 and 128, respectively. UBMs 32 and 132 may include a titanium layer and a copper layer over the titanium layer (not shown). Copper-containing pillars 34 and 134, which may be formed of substantially pure copper or a copper alloy, is formed on UBMs 32 and 132, respectively. In an embodiment, copper-containing pillars 34 and 134 are formed by plating. An exemplary plating process includes forming a blanket UBM layer (not shown, wherein UBMs 32 and 132 are portions of the blanket UBM layer), forming a mask (not shown) on the UBM layer, patterning the mask to form openings, plating copper-containing pillars 34 and 134 in the openings, and removing the mask and the portion of the UBM layer previously covered by the mask. Copper-containing pillars 34 and 134 extend over top surface 30A of dielectric layer 30, and edge portions of copper-containing pillars 34 and 134 may overlap portions of dielectric layer 30. The horizontal dimension W1 of copper-containing pillar 134 is greater than horizontal dimension W2 of copper-containing pillar 34, with ratio W1/W2 being greater than 1, or greater than about 2. Furthermore, horizontal dimension W1 may be great enough so that copper-containing pillar 134 is large enough for placing probe pins of probe cards (not shown), for example thereon. On the other hand, copper-containing pillar 34 may not be used for probing, and hence horizontal dimension W2 may not be large enough for the probe pins.

Non-copper metal layers 36 and 136, which are free from copper or substantially free from copper, are formed on the top surfaces of copper-containing pillars 34 and 134, respectively, and may be formed of metal materials selected from Ni, Co, Sn, Pd, Bi, Ag, Cd, Au, Zn, and combinations thereof.

Figure 2:
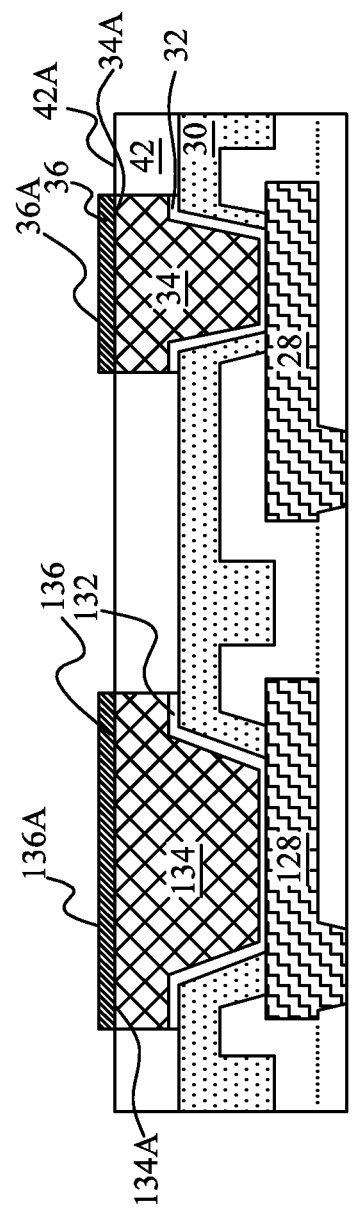

Referring to FIG. 2, polymer layer 42 is formed, for example, by coating. Top surface 42A of polymer layer 42 may be higher than top surfaces 34A and 134A of copper-containing pillars 34 and 134, and may be higher or lower than top surfaces 36A and 136A of non-copper metal layers 36 and 136. Polymer layer 42 may be formed of a photo-sensitive material, which may be a photo resist and/or polyimide. Furthermore, the material of polymer layer 42 is selected so that it can react with copper, but does not react with non-copper metal layers 36 and 136. The usable materials of polymer layer 42 include, and are not limited to, benzene-based polymers, dioxane-based polymers, toluene-based polymers, phenylthiol-based polymers, phenol-based polymers, cyclohexane-based polymers, p-Cresol-based polymers, and the like. Exemplary materials of polymer layer 42 include polybenzoxazole (PBO), polyimide, 2,3-Dimethylphenol, 2,4-Dimethylphenol, 2,6-Dimethylphenol, 3,4-Dimethylphenol, 1,3,5-xylenol, p-Ethylphenol, and combinations thereof.

Figure 3:
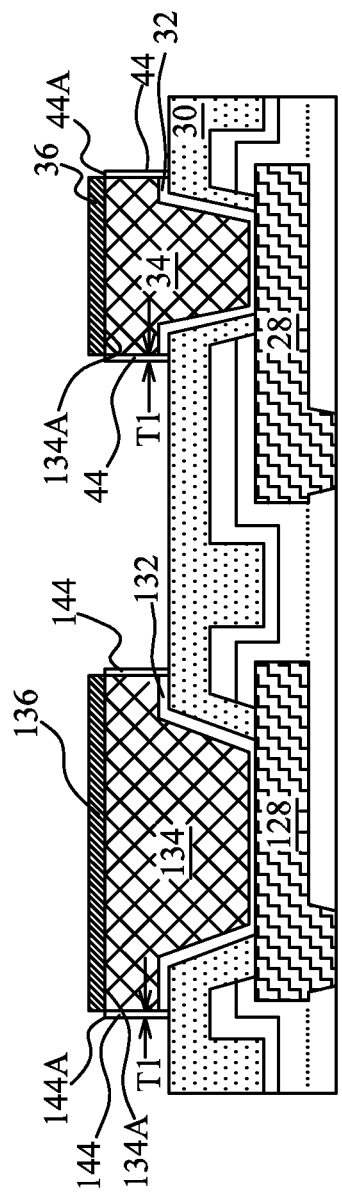
Figure 4:
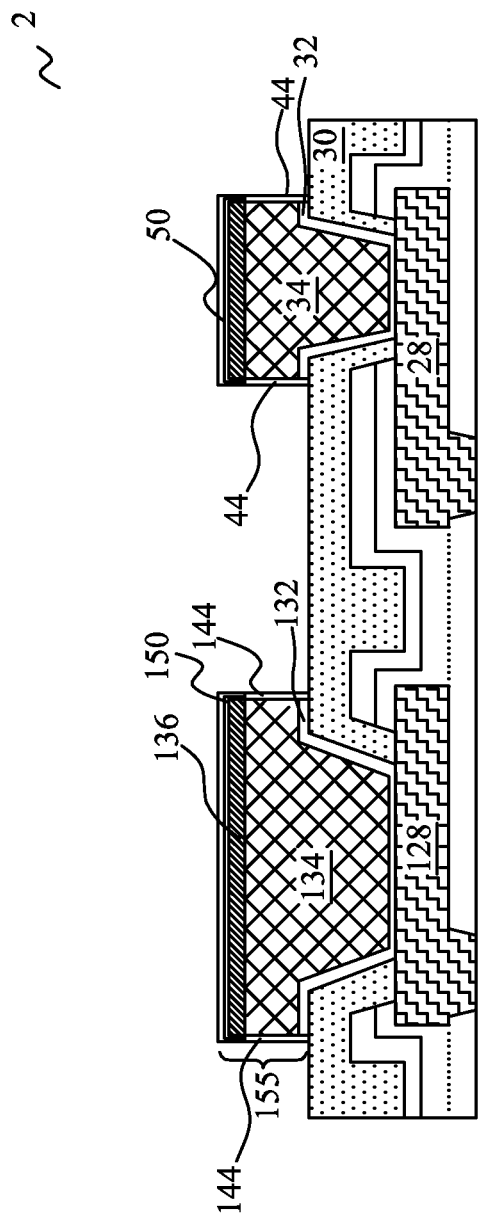

After the coating of polymer layer 42, polymer layer 42 is exposed to light, followed by a curing step. The curing is performed at a low-temperature, which may be lower than about 190° C., and may be between about 150° C. and about 190° C., for example. The duration of the curing may be between about one hour and two hours, although different temperatures and durations may be used. With the low-temperature curing, the underlying dielectric layer 30, which may be formed of a polyimide, is not damaged. Referring to FIG. 3, during the curing step, polymer layer 42 reacts with copper in the surface portion of the respective copper-containing pillars 34 and 134 where they contact to form protection layers 44 and 144, respectively. The resulting protection layers 44 and 144 are shown in FIG. 4. Protection layers 44 and 144 are copper-containing polymer-based dielectric layers comprising a copper-containing polymer-based compound. In an embodiment, thickness T1 of protection layers 44 and 144 is between about 5 nm and about 500 nm. Furthermore, protection layers 44 and 144 may have a substantially uniform thickness T1. Protection layers 44 and 144 may be limited on the sidewalls of copper-containing pillars 34 and 134, respectively, with no portion of protection layers 44 and 144 extending on the top surface of dielectric layer 30. Furthermore, in the top view of FIG. 3, protection layers 44 and 144 may encircle copper-containing pillars 34 and 134, respectively.

Polymer layer 42 does not react with non-copper metal layers 36 and 136. As a result, no protection layers 44 and 144 are formed on the top surface and edges of non-copper metal layers 36 and 136. In addition, the top edges 44A and 144A of protection layers 44 and 144 are substantially level with the top surfaces 34A and 134A of copper-containing pillars 34 and 134, respectively. Protection layers 44 and 144 have the function of protecting copper-containing pillars 34 and 134 from the oxidation in the die-to-wafer bonding process.

FIG. 3 also illustrates the removal of polymer layer 42, which is removed after the formation of protection layers 44 and 144. During the removal of polymer layer 42, the underlying dielectric layer 30 is not removed. It is noted that even if polymer layer 42 and dielectric layer 30 are formed of a same photo resist, dielectric layer 30 can still remain not removed since it may have been cured in preceding process steps before they are exposed to light. Further, dielectric layer 30 and polymer layer 42 may also be formed of different materials. In the resulting structure, protection layers 44 and 144 exist on the sidewalls, but not on the top surfaces, of the respective copper-containing pillars 34 and 134.

Referring to FIG. 4, metal finishes 50 and 150 are formed on non-copper metal layers 36 and 136, respectively, for example, by electro-less plating. Metal finishes 50 and 150 may have a single-layer structure or a composite structure including a plurality of sub-layers formed of different materials. In an embodiment, metal finishes 50 and 150 are formed of electro-less nickel electro-less palladium immersion gold (ENEPIG), which includes a nickel layer, a palladium layer on the nickel layer, and a gold layer on the palladium layer. The gold layer may be formed using immersion plating. In other embodiments, metal finishes 50 and 150 may be formed of other finish materials and methods, including, but not limited to, electro-less nickel immersion gold (ENIG), direct immersion gold (DIG), or the like. Metal finishes 50 and 150 are selectively formed directly over the top surfaces and sidewalls of non-copper metal layers 36 and 136, respectively, and are not formed on sidewalls of protection layers 44 and 144. Throughout the description, the structure including copper-containing pillar 134, protection layer 144, non-copper metal layer 136, and metal finish 150 in combination are referred to as test pad 155 hereinafter.

Figure 5:
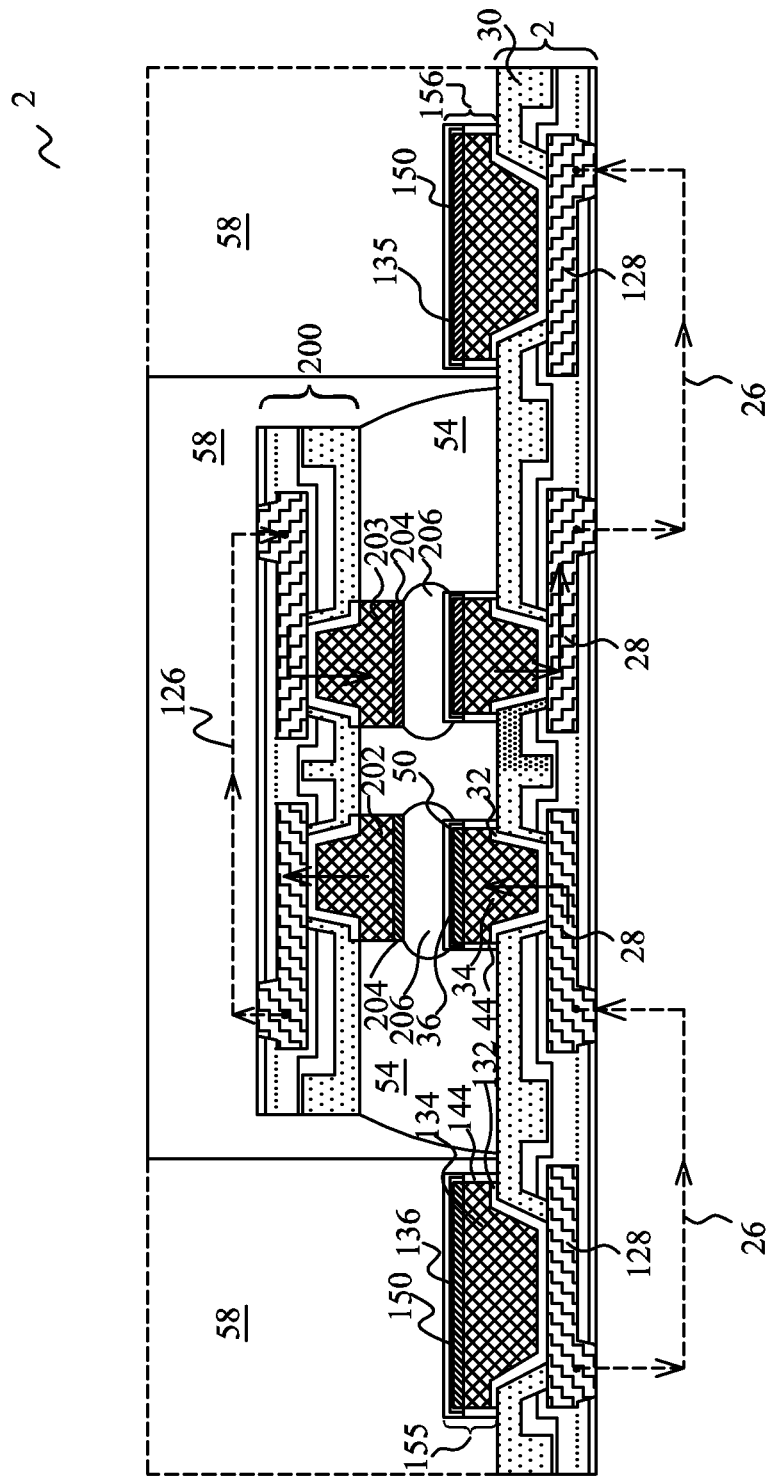

FIG. 5 illustrates the bonding of work piece 2 and work piece 200. Each of work pieces 2 and 200 may be inside an un-sawed wafer, or may be a discrete die already sawed from the respective wafer. The bonding is thus a die-to-wafer bonding, a wafer-to-wafer bonding, or a die-to-die bonding. Work piece 200 may be a device die, an interposer, a package substrate, or the like. Work piece 200 may include electrical connectors such as copper-pillar bumps or solder bumps, which electrical connectors are used for bonding. In an embodiment, as shown in FIG. 5, work piece 200 includes copper-containing pillar 202, and barrier layer (such as a nickel layer) 204 on a surface of copper-containing pillar 202. Solder region 206 joins barrier layer 204 and copper-containing pillar 202 to metal finish 50, wherein the joint may be achieved through the reflow of solder region 206. After the bonding of work pieces 2 and 200, underfill 54 may be filled into the gap between work pieces 2 and 200. Molding compound 58 may also be molded on work piece 200. Molding compound 58 may, or may not (as shown by dashed lines), cover test pad 155.

Test pad 155 is not bonded to any additional work piece such as a device die, an interposer, or the like. Test pad 155 may be used for testing the yield of known-good-dies and the joints between work pieces 2 and 200. For example, referring to FIG. 5, additional portions of work pieces 2 and 200 are shown, wherein an additional test pad 156 similar to test pad 155 is illustrated. Furthermore, copper-containing pillar 202 may be electrically coupled to copper-containing pillar 203 that is similar to copper-containing pillar 202. A daisy chain (shown by a plurality of arrows) is formed between test pads 155 and 156, wherein the daisy chain includes copper-containing pillars 202 and 203, copper-containing pillars 134 and 135, and the connections inside work pieces 2 and 200, which are represented by dashed lines 26 and 126, respectively. By probing test pads 155 and 156, the connection status of copper-containing pillars 202, 203, 134, and 135, and the corresponding connections 26 and 126 in work pieces 2 and 200 may be determined. When molding compound 58 does not cover test pads 155 and 156, the probing may be performed before or after molding compound 58 is applied. Alternatively, when molding compound 58 covers test pads 155 and 156, the probing may be performed before molding compound 58 is applied.

FIGS. 6 through 13 illustrate cross-sectional views of intermediate stages in the formation of a package in accordance with alternative embodiments. Unless specified otherwise, the materials and formation methods of the components in these embodiments (and in the embodiments shown in FIGS. 14 and 15) are essentially the same as the like components, which are denoted by like reference numerals in the embodiment shown in FIGS. 1 through 5. The formation details of the components shown in FIGS. 6 through 15 may be found in the discussion of the embodiment shown in FIGS. 1 through 5.

Figure 6:
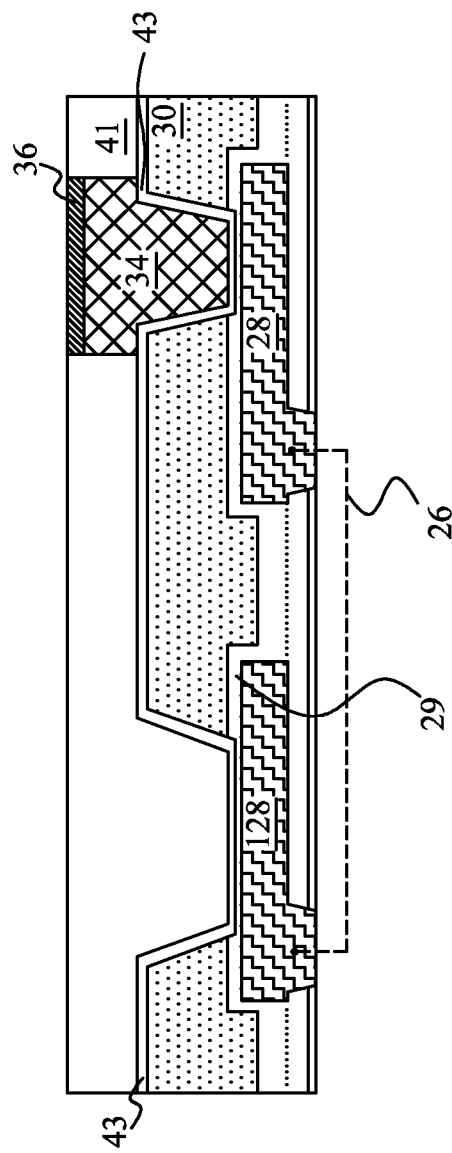
FIGS. 6 through 13 are cross-sectional views of intermediate stages in the formation of a package structure in accordance with alternative embodiments, wherein a test pad comprises a metal finish, and does not comprise a copper-containing pillar.

Referring to FIG. 6, an initial structure is formed. This structure is similar to the structure shown in FIG. 1, except that copper-containing pillar 134 and non-copper metal layer 136 are not formed. Photo resist 41 is formed and patterned for the formation of copper-containing pillar 34 and non-copper metal layer 36. In the formation of copper-containing pillar 34 and non-copper metal layer 36, the portion of the UBM layer 43 directly over metal pad 128 may be masked by photo resist 41, and copper-containing pillar 34 and non-copper metal layer 36 are plated in the opening in photo resist 41.

Figure 7:
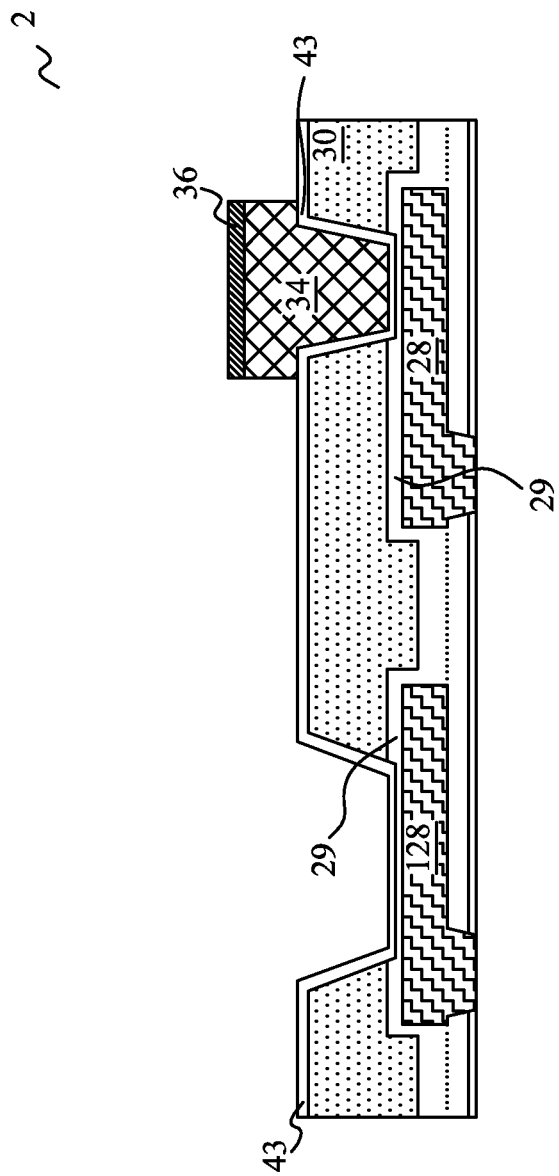
Figure 8:
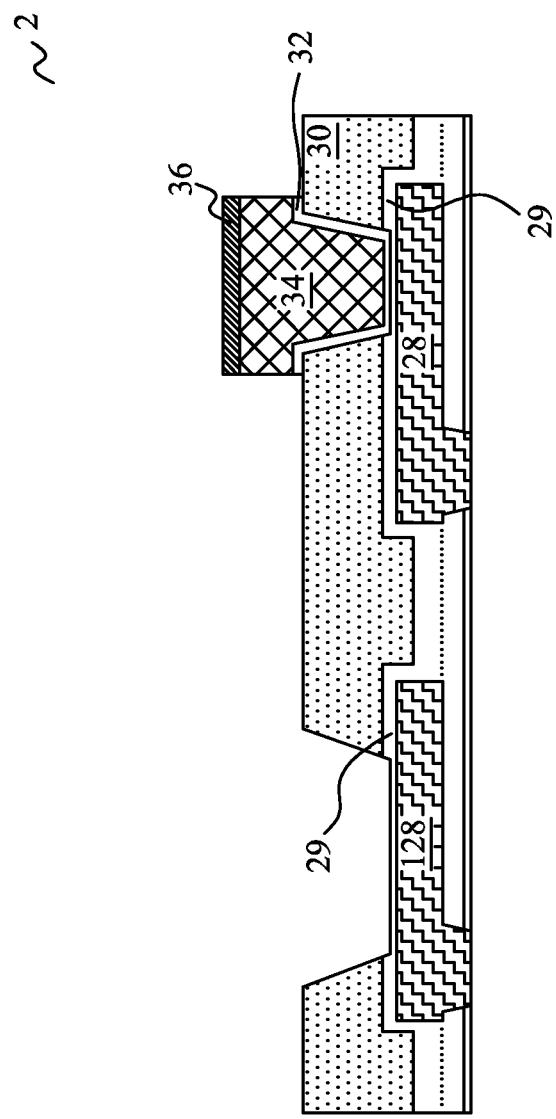
Figure 9:
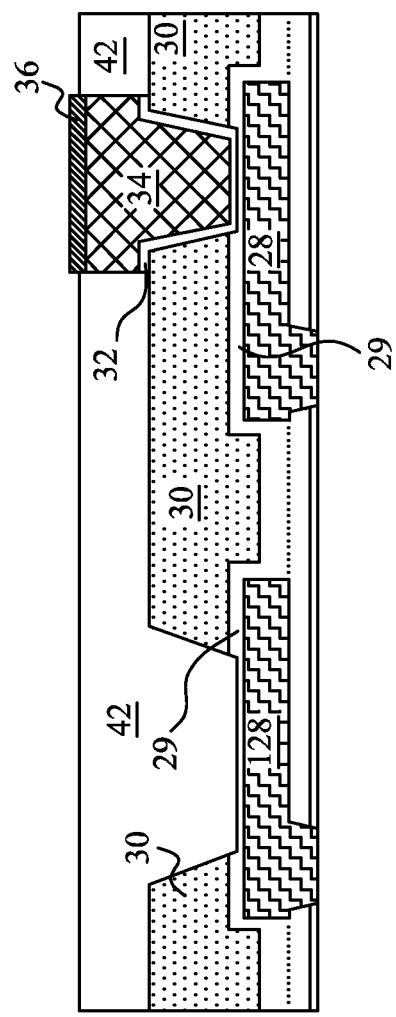
Figure 10:
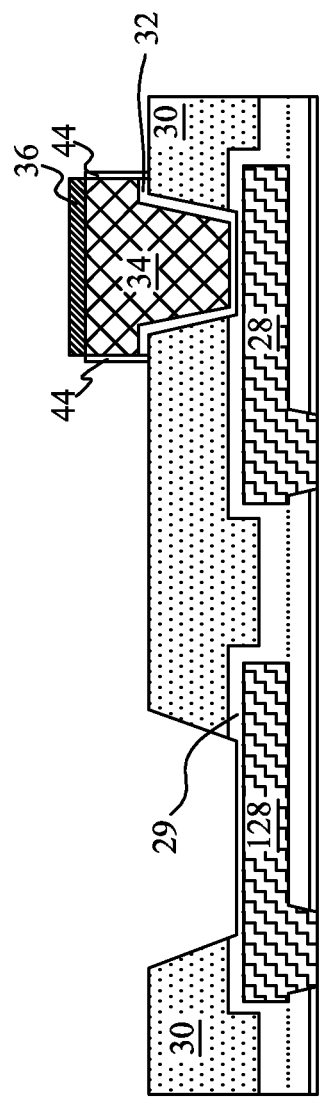
Figure 11:
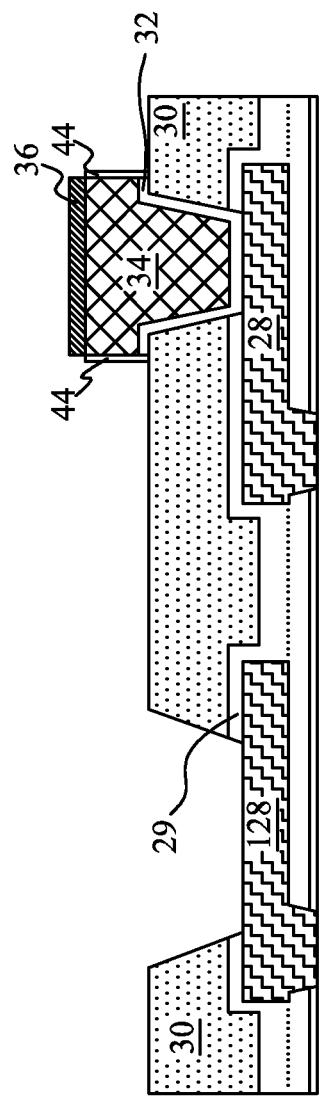

Next, as shown in FIG. 7, photo resist 41 is removed, and portions of UBM layer 43 are exposed. The exposed portions of UBM layer 43 are then removed, and the resulting structure is shown in FIG. 8. A portion of dielectric layer 29, which portion is directly over and covers metal pad 128, is thus exposed. A remaining portion of UBM layer 43 forms UBM 32. Referring to FIG. 9, polymer layer 42 is formed to contact copper-containing pillar 34. Next, refer to FIG. 10, a light exposure and a curing is performed to form protection layer 44 on the sidewalls of copper-containing pillar 34. After the formation of protection layer 44, polymer layer 42 is removed. Next, an etching step is performed to etch the exposed portion of dielectric layer 29, so that metal pad 128 is exposed, and the resulting structure is shown in FIG. 11.

Figure 12:
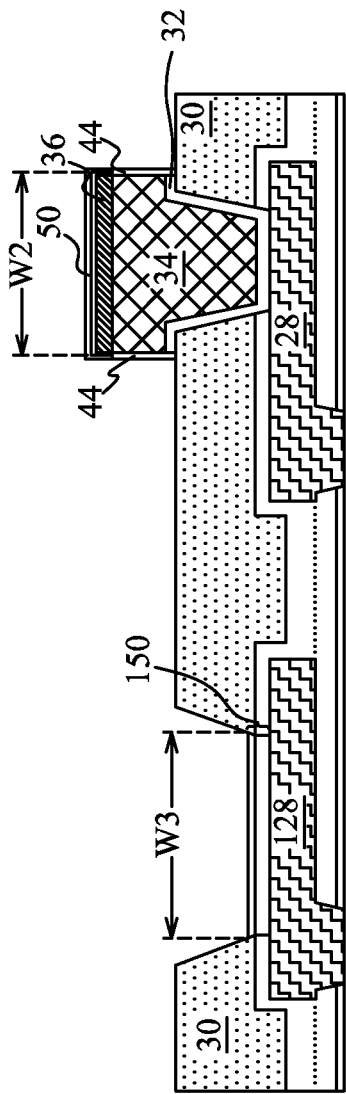

Referring to FIG. 12, metal finishes 50 and 150 are formed. The material and the formation methods of metal finishes 50 and 150 may be essentially the same as that for forming metal finishes 50 and 150 in FIG. 4. Throughout the description, metal finish 150 is also referred to as test pad 150. The ratio W3/W2 may be essentially the same as ratio W1/W2 (FIG. 1), wherein width W3 is the horizontal dimension of test pad 150. The resulting work piece 2 is then bonded to work piece 200, as shown in FIG. 13.

Figure 13:
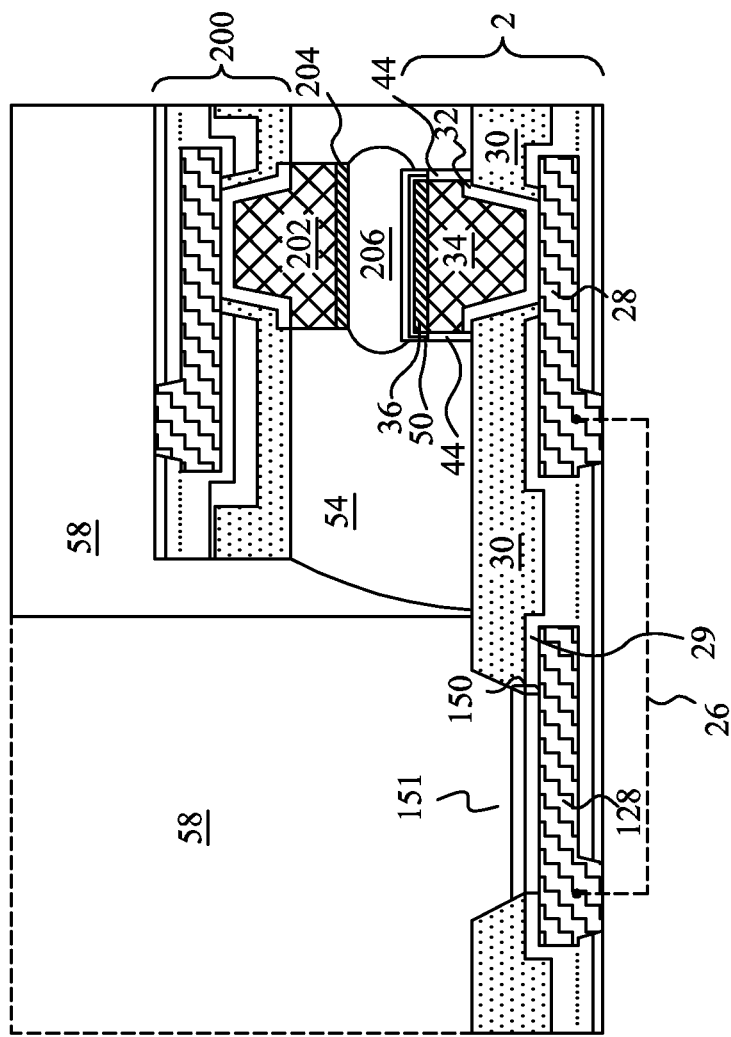

The structure shown in FIG. 13 is similar to the structure in FIG. 5, except that test pad 150 is different from test pad 155 in FIG. 5. The remaining parts are essentially the same as shown in FIG. 5. The function and the usage of test pad 155 are also similar to the function and the usage of test pad 155 in FIG. 5. For example, the respective probing scheme using test pad 150 may be similar to the probing using test pad 155 in FIG. 5, and the respective daisy chain for the probing may also refer to FIG. 5. Test pad 150 comprises at least a portion recessed in opening 151 in dielectric layer 30, which may be formed of polyimide, for example.

Figure 14:
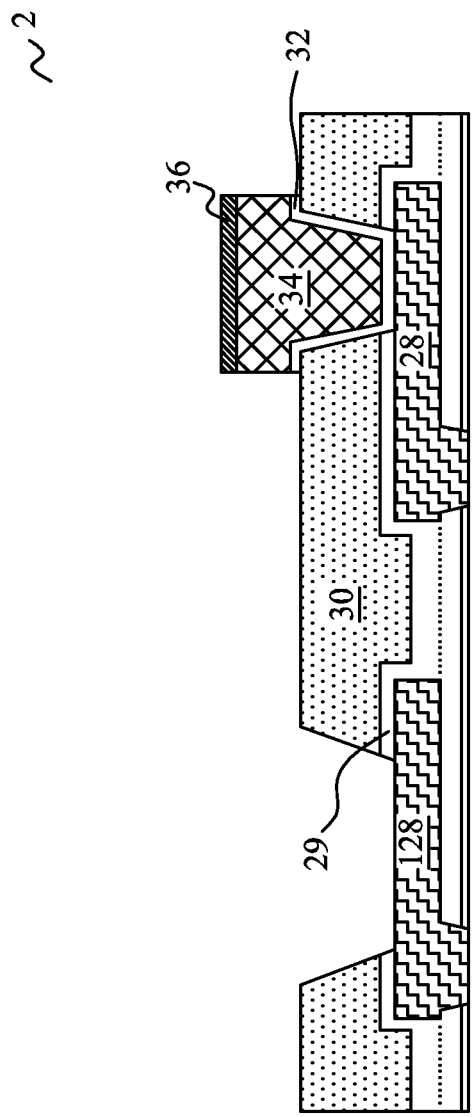
FIGS. 14 and 15 are cross-sectional views of intermediate stages in the formation of a package structure in accordance with yet alternative embodiments, wherein an aluminum pad is used as a test pad.
Figure 15:
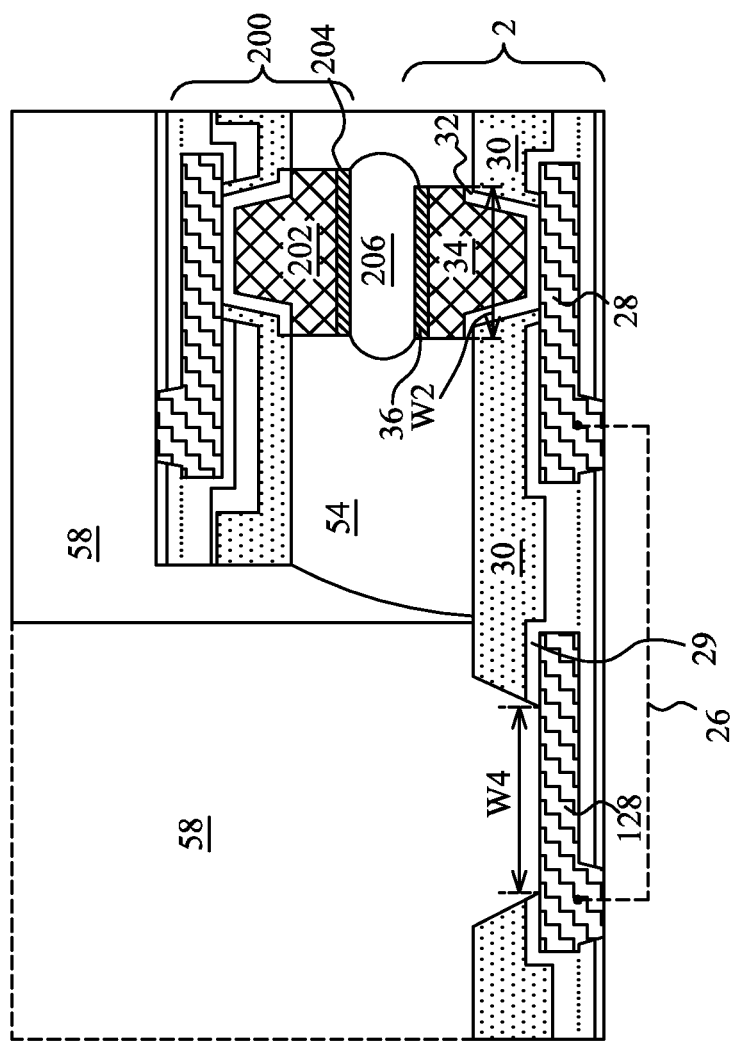

FIGS. 14 and 15 illustrate cross-sectional views of intermediate stages in the formation of a package in accordance with yet alternative embodiments. The initial steps of these embodiments are essentially the same as shown in FIGS. 6 through 8, and hence the details are not repeated herein. In these embodiments, metal pads 28 and 128 may be aluminum pads that are substantially free from copper. Alternatively, metal pads 28 and 128 may comprise copper, and the copper in metal pads 28 and 128 has a percentage less than about five percent. After the structure as shown in FIG. 8 is formed, the process proceeds to the step shown in FIG. 14, in which the exposed portion of dielectric layer 29 is etched, and hence the underlying metal pad 128 is exposed.

Next, as shown in FIG. 15, work piece 2 is bonded to work piece 200. The exposed metal pad 128 is used as the test pad for probing work pieces 2 and 200. Accordingly, width W4 of the exposed portion of test pad 128 may be great enough, so that ratio W4/W2 is similar to ratio W1/W2 (FIG. 1). The respective probing scheme may be found in FIG. 5, and the respective daisy chain for the probing may also be similar to what is shown in FIG. 5.

In accordance with embodiments, a work piece includes a first copper-containing pillar having a top surface and sidewalls, and a first protection layer on the sidewalls, and not over the top surface, of the first copper-containing pillar. A test pad includes a second copper-containing pillar having a top surface and sidewalls. The test pad is electrically coupled to the first copper-containing pillar. A second protection layer is disposed on the sidewalls, and not over the top surface, of the second copper-containing pillar. The first and the second protection layers include a compound of copper and a polymer, and are dielectric layers.

In accordance with other embodiments, a work piece is formed. The work piece includes a dielectric layer at a surface of the first work piece, and a first and a second metal pad under the dielectric layer and level with each other, wherein the first and the second metal pads are electrically coupled to each other. The work piece further includes a copper-containing pillar having a top surface and sidewalls, wherein the top surface of the copper copper-containing pillar is over a top surface of the dielectric layer, and wherein the copper-containing pillar overlaps a portion of the first metal pad. A non-copper metal layer is disposed over and contacting the top surface of the copper-containing pillar. A metal finish is disposed over and contacting a top surface and sidewalls of the non-copper metal layer. A test pad is disposed over the second metal pad, wherein the test pad and the metal finish are formed of a same material, and are electrically coupled to each other through the first and the second metal pads.

In accordance with yet other embodiments, a work piece includes a dielectric layer at a surface of the first work piece, a first metal pad under the dielectric layer, wherein the dielectric layer has a first opening over the metal pad, and a copper-containing pillar having a top surface and sidewalls, wherein the top surface of the copper copper-containing pillar is over a top surface of the dielectric layer, and wherein the copper-containing pillar overlaps the first metal pad. The work pieces further includes a second metal pad under the dielectric layer, and exposed through a second opening in the dielectric layer. The first and the second metal pads are level with each other, and are electrically coupled to each other, wherein no copper-containing pillar is disposed over and overlapping the second metal pad.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising: a first work piece comprising: a first copper-containing pillar having a top surface and sidewalls; a first protection layer on the sidewalls, and not over the top surface, of the first copper-containing pillar; a test pad comprising a second copper-containing pillar having a top surface and sidewalls, wherein the test pad is electrically coupled to the first copper-containing pillar; and a second protection layer on the sidewalls, and not over the top surface, of the second copper-containing pillar, wherein the first and the second protection layers comprise a compound of copper and a polymer, and wherein the first and the second protection layers are dielectric layers; and an underfill, wherein the first copper-containing pillar and the underfill are on opposite sides of, and are in physical contact with, the first protection layer, wherein the first protection layer comprises a first edge contacting the first copper-containing pillar, and a second edge opposite to the first edge, and wherein the compound of copper and the polymer extends from the first edge to the second edge.

2. The device of claim 1 further comprising a first and a second non-copper metal layer over and contacting the top surfaces of the first and the second copper-containing pillars, wherein the first protection layer extends to an interface between the first copper-containing pillar and the first non-copper metal layer, and does not extend on sidewalls of the first non-copper metal layer.

3. The device of claim 2 further comprising metal finishes contacting a top surface and sidewalls of each of the first and the second non-copper metal layers.

4. The device of claim 1 further comprising a polyimide layer, wherein the first and the second copper-containing pillars comprise portions over and overlapping the polyimide layer, and wherein the first and the second protection layers do not comprise horizontal portions extending on a top surface of the polyimide layer.

5. The device of claim 1 further comprising:
a second work piece over the first work piece; and
an electrical connector bonding the second work piece to the first work piece, wherein the electrical connector comprises at least a portion directly over and electrically coupled to the first copper-containing pillar.

6. The device of claim 5 further comprising a molding compounding molding the second work piece therein, wherein the test pad is not bonded to any additional work piece.

7. The device of claim 1, wherein top edges of the first and the second protection layers are substantially coplanar with the top surface of the first copper-containing pillar and the top surface of the second copper-containing pillar, respectively.

8. The device of claim 1, wherein the polymer is selected from the group consisting of polybenzoxazole (PBO), polyimide, 2,3-Dimethylphenol, 2,4-Dimethylphenol, 2,6-Dimethylphenol, 3,4-Dimethylphenol, 1,3,5-xylenol, p-Ethylphenol, and combinations thereof.

9. A device comprising: a first work piece comprising: a dielectric layer at a surface of the first work piece; a first metal pad and a second metal pad under the dielectric layer and level with each other, wherein the first and the second metal pads are electrically coupled to each other; a copper-containing pillar having a top surface and sidewalls, wherein the top surface of the copper-containing pillar is over a top surface of the dielectric layer, and wherein the copper-containing pillar overlaps a portion of the first metal pad; a non-copper metal layer over and contacting the top surface of the copper-containing pillar; a protection layer on the sidewalls, and not over the top surface, of the copper-containing pillar, wherein the protection layer comprises a compound of copper and a polymer, wherein the protection layer is a dielectric layer, and wherein a top edge of the protection layer is substantially coplanar with the top surface of the copper-containing pillar; a metal finish over and contacting a top surface and sidewalls of the non-copper metal layer; and a test pad over the second metal pad, wherein the test pad and the metal finish are formed of a same material, and are electrically coupled to each other through the first and the second metal pads, wherein the protection layer comprises a first edge contacting the copper-containing pillar, and a second edge opposite to the first edge, and wherein the compound of the copper and the polymer extends from the first edge to the second edge.

10. The device of claim 9 further comprising an underfill contacting the second edge.

11. The device of claim 9, wherein the dielectric layer comprises a polyimide layer.

12. The device of claim 9 further comprising:
a second work piece over the first work piece; and
an electrical connector bonding the second work piece to the first work piece, wherein the electrical connector comprises at least a portion directly over and electrically coupled to the copper-containing pillar.

13. The device of claim 12 further comprising a molding compound molding the second work piece therein, wherein the test pad is not covered by the molding compound.

14. The device of claim 9 further comprising an underfill, wherein the copper-containing pillar and the underfill are on opposite sides of, and are in physical contact with, the protection layer.

15. The device of claim 9, wherein the polymer is selected from the group consisting of polybenzoxazole (PBO), polyimide, 2,3-Dimethylphenol, 2,4-Dimethylphenol, 2,6-Dimethylphenol, 3,4-Dimethylphenol, 1,3,5-xylenol, p-Ethylphenol, and combinations thereof.

* * * * *